(12) United States Patent
Fukuda et al.

(10) Patent No.: US 9,011,718 B2
(45) Date of Patent: Apr. 21, 2015

(54) BLUE LIGHT-EMITTING PHOSPHOR AND LIGHT-EMITTING DEVICE USING THE BLUE LIGHT-EMITTING PHOSPHOR

(71) Applicant: Ube Material Industries, Ltd., Ube-shi, Yamaguchi (JP)

(72) Inventors: Kouichi Fukuda, Ube (JP); Jin Amagai, Ube (JP); Seiji Noguchi, Ube (JP); Toru Inagaki, Ube (JP); Masaki Tanaka, Ube (JP)

(73) Assignee: Ube Material Industries, Ltd., Ube-shi, Yamaguchi (JP)

( * ) Notice: Subject to any disclaimer, the term of this patent is extended or adjusted under 35 U.S.C. 154(b) by 166 days.

(21) Appl. No.: 13/626,071

(22) Filed: Sep. 25, 2012

(65) Prior Publication Data

US 2014/0084780 A1  Mar. 27, 2014

(51) Int. Cl.
*C09K 11/55* (2006.01)
*C09K 11/59* (2006.01)
*C09K 11/77* (2006.01)
*H01L 33/50* (2010.01)

(52) U.S. Cl.
CPC ........... *C09K 11/7734* (2013.01); *H01L 33/502* (2013.01)

(58) Field of Classification Search
CPC .......... C09K 11/7792; C09K 11/7734; H01L 33/502
USPC ........ 252/301.4 F; 313/503; 257/98
See application file for complete search history.

(56) References Cited

U.S. PATENT DOCUMENTS

| | | | |
|---|---|---|---|
| 7,161,298 B2 * | 1/2007 | Kawamura et al. ........... | 313/582 |
| 7,221,083 B2 * | 5/2007 | Oaku et al. ................... | 313/485 |
| 2008/0048547 A1 * | 2/2008 | Oaku et al. ................... | 313/486 |
| 2009/0315448 A1 * | 12/2009 | Kuze et al. ................... | 313/503 |

FOREIGN PATENT DOCUMENTS

| JP | 2006-31654 | * 11/2006 |
|---|---|---|
| JP | 2006-312654 | 11/2006 |
| JP | 2010-003790 | 1/2010 |

* cited by examiner

*Primary Examiner* — Carol M Koslow
(74) *Attorney, Agent, or Firm* — Nixon Peabody LLP; Jeffrey L. Costellia

(57) ABSTRACT

The emission strength of a light released from a blue light-emitting phosphor having a merwinite crystal structure and an elemental formula of $(Sr,Ca)_3MgSi_2O_8$ activated with Eu in which a molar ratio of Sr and Ca is in the range of 1:0.10 to 1:0.30 is stable in a wide temperature range.

2 Claims, 1 Drawing Sheet

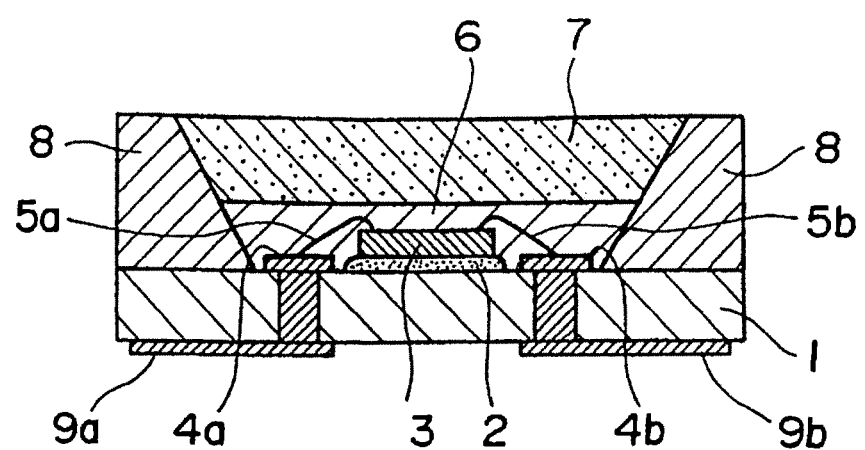

BLUE LIGHT-EMITTING PHOSPHOR AND LIGHT-EMITTING DEVICE USING THE BLUE LIGHT-EMITTING PHOSPHOR

FIELD OF THE INVENTION

The present invention relates to a blue light-emitting phosphor which is of a value as a blue light-emitting material of a white light-emitting LED, and particularly relates to a blue light-emitting phosphor having a merwinite crystal structure and an elemental formula of $(Sr,Ca)_3MgSi_2O_8$ activated with Eu.

BACKGROUND OF THE INVENTION

Until a recent date, widely utilized white light-emitting LEDs have been of a double color admixture type of which white light is produced by mixing a blue light released from a semiconductor light-emitting element upon activation by electric energy and a yellow light emitted from a yellow light-emitting phosphor upon excitation with the blue light from the semiconductor light-emitting element. However, there is a problem in the white light emitted from the white light-emitting LED of the double color admixture type, in that the white light is not sufficiently pure. Therefore, there have been studied white light-emitting LEDs of a triple color admixture type which give a white light by mixing a blue light, a green light and a red light. The blue light, green light and red light are all released from a blue light-emitting phosphor, a green light-emitting phosphor and a red light-emitting phosphor by excitation with a light in the wavelength region of 350 to 430 nm which is released from a semiconductor light-emitting element by applying thereto electric energy.

As the blue light-emitting phosphor, a blue light-emitting phosphor having a crystal structure of merwinite ($Ca_3MgSi_2O_8$) and an elemental formula of $Sr_3MgSi_2O_8$ activated with divalent Eu is known. This blue light-emitting phosphor is hereinafter referred to as blue light-emitting SMS phosphor. This blue light-emitting SMS phosphor has been studied for the use as a blue light-emitting material in a plasma display and in a white light-emitting LED of the triple color admixture type (see Patent publication 1: JP 2006-312654 A).

In the JP 2006-312654 A, a blue light-emitting SMS phosphor having the below-described formula in which a portion of Sr is replaced with Ca is described:

$(Sr_{3-c-3x}Ca_cEu_{3x})MgSi_2O_8$ in which c is a number of 0.9 or less, and x is not less than 0.00016 but less than 0.003.

From the composition of the phosphors and data concerning a ratio of retention of emission strength given in Table 1 for the working examples of Patent publication 1, it is understood that the invention disclosed in Patent publication 1 has been made on the finding that the ratio of retention of the emission strength of the SMS phosphor observed when the phosphor is arranged in the form of a phosphor layer increases if the content of Eu is adjusted to be in the above-mentioned range. It is further noted that the blue light-emitting SMS phosphor of Patent publication 1 has been optimized for the use as a blue light-emitting material to be used in a plasma display, because the emission strength is evaluated for a vacuum ultraviolet light of a wavelength of 146 nm which is the wavelength mainly utilized for the plasma display. Thus, it is understood that the blue light-emitting SMS phosphor has been not optimized as a blue light-emitting source for the use in the white light-emitting LEDs.

JP 2010-3790 A (Patent publication 2) contains a description to the effect that an LED chip (semiconductor light-emitting element) generates heat up to such a high temperature as 120° C. when the LED chip is continuously activated for a long period of time or is activated by a high voltage current for elevating the emission strength. Accordingly, it is understood that a phosphor to be utilized as a visible light-generating material in a white light-emitting LED should give a light having an emission strength not varying with the variation of heat generated in the white light-emitting LED under activation, that is, should give a light of an emission strength stable at temperatures in the vicinity of 120° C.

SUMMARY OF THE INVENTION

As described above, phosphors utilized as visible light-emitting materials for the white light-emitting LED are required to give a light not largely varying with variation of temperatures in the range from room temperature to about 120° C. According to studies made by the present inventors, it has been noted that the emission strength of the light released from a known blue light-emitting SMS phosphor likely decreases with elevation of the surrounding temperature.

Accordingly, it is an object of the invention to provide a blue light-emitting SMS phosphor which gives a light showing stable emission strength.

The present inventors have found that stability of the emission strength of a light released from the blue light-emitting SMS phosphor by excitation with a light of the wavelength region of 350 to 430 nm under variation of the surrounding temperature is increased in the case that a portion of Sr is replaced with Ca in the blue light-emitting SMS phosphor to give a blue light-emitting SMS phosphor in which a molar ratio of Sr and Ca is adjusted to a value in the range of 1:0.10 to 1:0.30.

Accordingly, the present invention resides in a blue light-emitting phosphor having a merwinite crystal structure and an elemental formula of $(Sr,Ca)_3MgSi_2O_8$ activated with Eu in which a molar ratio of Sr and Ca is in the range of 1:0.10 to 1:0.30.

The preferred embodiments of the blue light-emitting phosphor of the invention are described below.

(1) The blue light-emitting phosphor is used for emitting a blue light by excitation with a light in the wavelength region of 350 to 430 nm released from a semi-conductor light-emitting element.

(2) Eu is contained in an amount of 0.01 to 0.20 mol per one mol of Mg.

(3) The blue light-emitting phosphor is co-activated with at least one rare earth metal element selected from the group consisting of Sc, Y, Gd, Tb and La.

(4) The molar ratio of Sr and Ca is in the range of 1:0.13 to 1:0.23.

The invention further resides in a light-emitting device comprising the blue light-emitting phosphor of the invention and a semiconductor light-emitting element which releases a light in the wavelength region of 350 to 430 nm.

Effects of Invention

The blue light-emitting SMS phosphor of the invention shows a light of high and stable emission strength in a high temperature range in the vicinity of 120° C., particularly at a temperature of from 100 to 150° C. Therefore, the blue light-emitting SMS phosphor of the invention is favorably employed as a blue light-emitting material subjected to high temperature conditions such as a blue light-emitting material of a white light-emitting LED device in which the inner temperature likely elevates to a temperature in the vicinity of 120° C.

In addition, the light-emitting device in which the blue light-emitting SMS phosphor of the invention is placed gives a light whose emission strength is stable within a wide temperature range.

BRIEF DESCRIPTION OF DRAWING

FIGURE is a section of one embodiment of a light-emitting device of the invention (white light-emitting LED).

EMBODIMENTS OF THE INVENTION

The blue light-emitting SMS phosphor of the invention has a merwinite crystal structure and an elemental formula of $(Sr,Ca)_3MgSi_2O_8$ in which a molar ratio of Sr and Ca (namely, Sr:Ca) is in the range of 1:0.10 to 1:0.30, preferably in the range of 1:0.13 to 1:0.23.

The blue light-emitting SMS phosphor of the invention is activated with a divalent Eu. It is preferred that Eu is substituted for Sr. The content of Eu in the blue light-emitting SMS phosphor is generally in the range of 0.01 to 0.20 mol, preferably in the range of 0.01 to 0.15 mol, more preferably in the range of 0.02 to 0.10, per one mol of Mg.

The blue light-emitting SMS phosphor of the invention can be co-activated with a rare earth metal element other than Eu, such as Sc, Y, Gd, Tb or La. It is preferred that the rare earth metal element is substituted for Sr. The content of the rare earth metal element is preferably in the range of 0.00010 to 0.030 mol, more preferably in the range of 0.0005 to 0.02 mol, most preferably in the range of 0.0008 to 0.02, per one mol of Mg. The rare earth metal element can be used alone or in combination. A molar ratio of the content of Eu to the content of the rare earth metal element other than Eu (namely, Eu/rare earth metal element) in the blue light-emitting SMS phosphor is preferably 1 or more, more preferably in the range of 1 to 300, most preferably in the range of 2 to 100.

The molar ratio among the metal elements of the blue light-emitting SMS phosphor of the invention can be deviated from that of the elemental formula, so far as the phosphor has the merwinite crystal structure. Preferably the molar ratio among the metal elements of the blue light-emitting SMS phosphor is as follows: The total amount of Sr, Ca, Eu and a rare earth metal element other than Eu preferably is in the range of 2.9 to 3.1 mols and the amount of Si is in the range of 1.9 to 2.1 mols, per one mol of Mg.

One example of the blue light-emitting SMS phosphor of the invention is a phosphor represented by the following formula:

in which Ln is at least one rare earth metal element selected from the group consisting of Sc, Y, Gd, Tb and La; a+b+c+d is in the range of 2.9 to 3.1; b/a is in the range of 0.10 to 0.30, c is in the range of 0.01 to 0.20, d is in the range of 0 to 0.030, and e is in the range of 1.9 to 2.1.

The surface of the blue light-emitting SMS phosphor of the invention can be treated with a gas produced by thermal decomposition of ammonium fluoride. The surface treatment can reduce lowering of the emission strength of the phosphor occurring when the phosphor is heated under atmospheric conditions. The surface treatment can be carried out preferably by placing a mixture of the blue light-emitting SMS phosphor and ammonium fluoride in a heat-resistant vessel such as a crucible and heating the vessel on which a lid is placed. The ammonium fluoride is preferably added generally in an amount of 0.1 to 30 parts by weight, preferably in an amount of 0.1 to 15 parts by weight, to 100 parts by weight of the blue light-emitting SMS phosphor. The temperature used for the heat treatment is generally in the range of 300 to 600° C., preferably 300 to 500° C., more preferably 300 to 480° C. The heat treatment is generally carried out for 1 to 5 hours.

The blue light-emitting SMS phosphor of the invention can be prepared, for example, by mixing a powdery Sr source, a powdery Ca source, a powdery Mg source, a powdery Si source, a powdery Eu source and, if necessary, a powdery rare earth metal element source (other than Eu source) in a ratio adjusted to give the blue light-emitting SMS phosphor, and calcining the resulting powdery source mixture. Each of the powdery Sr source, powdery Ca source, powdery Mg source, powdery Si source, powdery Eu source and powdery rare earth metal element source can be a powdery oxide or a powdery compound convertible to a powdery oxide by calcination, such as a powdery hydroxide, a powdery halide, a powdery carbonate (including basic carbonate), a powdery nitrate or a powdery oxalate. The powdery source material can be used alone or in combination. It is preferred that each powdery material has a purity of 99 wt. % or higher.

To the mixture of the powdery source materials can be added a flux. The flux is preferably a halide, more preferably a chloride. It is preferred that a chloride is employed as one of the powdery source materials so that the chloride can serve as flux. It is particularly preferred that the powdery strontium source is a powdery strontium chloride. The amount of the flux is preferably in the range of 0.0001 to 0.5 mol, more preferably in the range of 0.02 to 0.5 mol, in terms of halogen content, per the amount of magnesium in the powdery mixture.

The powdery mixture can be prepared by any one of wet mixing procedures and dry mixing procedures. The wet mixing procedures can be carried out by means of a rotating ball mil, a vibrating ball mill, a planetary mill, a paint shaker, a rocking mill, a rocking mixer, a bead mill, or a stirring apparatus. In the wet mixing procedures, a solvent such as water or a lower alcohol (e.g., ethanol or isopropyl alcohol) can be employed.

The powdery material mixture is calcined in a reducing atmosphere comprising hydrogen of 0.5 to 5.0 vol. % and an inert gas of 99.5 to 95.0 vol. %. The inert gas can be argon or nitrogen. The calcination can be carried out generally at 900 to 1,300° C. generally for 0.5 to 100 hours.

If the source material giving an oxide by the calcination is employed as the powdery source material, it is preferred that the powdery material mixture is pre-calcined in atmospheric conditions at 600-850° C. for 0.5 to 100 hours in advance of performing the calcination under the reducing atmosphere. The blue light-emitting SMS obtained by the calcination can be post-treated, if desired, by classification, acid-washing treatment using a mineral acid such as hydrochloric acid or nitric acid, or baking.

The light-emitting device employing the blue light-emitting SMS phosphor of the invention FIGURE.

FIGURE is a section of one embodiment of the white light-emitting LED employing the blue light-emitting SMS phosphor of the invention.

In FIGURE, the white light-emitting LED comprises a base 1, a semiconductor light-emitting element 3 fixed onto the base 1 via an adhesive 2, a pair of electrodes 4a,4b formed on the base 1, electric leads 5a,5b electrically connecting the semiconductor light-emitting element 3 with the electrodes 4a,4b, a resin layer 6 covering the semiconductor light-emitting element 3, a phosphor layer 7 formed on the resin layer 6, a light-reflecting material 8 covering the resin layer 6 and phosphor layer 7, and electric wires 9a,9b connecting the electrodes 4a,4b with an outside electric source (not shown). The phosphor layer 7 comprises the blue light-emitting SMS phosphor, a green light-emitting phosphor and a red light-emitting phosphor all dispersed in glass or a transparent resin such as silicone resin. When electric energy is applied to the electrodes 4a,4b of the white light-emitting LED via the electric wires 9a,9b, the semiconductor light-emitting element 3 releases a light emission having a peak in the wavelength region of 350 to 430 nm. The released light emission then excites each of the light-emitting phosphors in the phosphor layer 7 to release visible lights such as a blue light, a green light, and a red light. The thus released blue light, a green light, and a red light mix altogether to produce a white light.

The semiconductor light-emitting element 3 can be an Al—Ga—N type semiconductor light-emitting element. The resin layer 6 can comprise silicone resin. Examples of the green light-emitting phosphor include $(Ca,Sr,Ba)_2SiO_4$:$Eu^{2+}$, $BaMgAl_{10}O_{17}$:$Eu^{2+}$, $Mn^{2+}$, $\alpha$-SiAlON:$Eu^{2+}$, $\beta$-SiAlON:$Eu^{2+}$, and ZnS:Cu,Al. Examples of the red light-emitting phosphor include $Y_2O_2S$:$Eu^{2+}$, $La_2O_3S$:$Eu^{2+}$, $(Ca,Sr,Ba)_2 Si_5N_8$:$Eu^{2+}$, $CaAlSiN_3$: $Eu^{2+}$, $Eu_2W_2O_9$, $(Ca,Sr,Ba)_2 Si_5N_8$:$Eu^{2+}$, $Mn^{2+}$, $CaTiO_3$:$Pr^{3+}$, $Bi^{3+}$, and $(La,Eu)_2W_3O_{12}$.

EXAMPLES

The powdery source materials employed in Examples and Comparison Examples are described below:

(1) powdery strontium carbonate ($SrCO_3$): purity 99.7 wt. %, mean particle diameter 0.9 μm (measured by laser diffraction scattering method), (2) powdery strontium chloride ($SrCl_2.6H_2O$): purity 99 wt. %, (3) powdery calcium carbonate ($CaCO_3$): purity 99.99 wt. %, mean particle diameter 3.87 μm (measured by laser diffraction scattering method), (4) powdery europium oxide ($Eu_2O_3$): purity 99.9 wt. %, mean particle diameter 2.7 μm (measured by laser diffraction scattering method), (5) powdery magnesium oxide (MgO): prepared by the gas phase oxidation process, purity 99.98 wt. %, particle diameter 0.2 μm (calculated from BET specific surface area), (6) powdery silicon dioxide ($SiO_2$): purity 99.9 wt. %, particle diameter 0.01 μm (calculated from BET specific surface area), and (7) powdery yttrium oxide ($Y_2O_3$): purity 99.9 wt. %.

Example 1

The powdery $SrCO_3$, powdery $SrCl_2.6H_2O$, powdery $CaCO_3$, powdery $Eu_2O_3$, powdery MgO and powdery $SiO_2$ were weighed to give a molar ratio of 2.445:0.125:0.360:0.035:1:2.000 for $SrCO_3$:$SrCl_2.6H_2O$:$CaCO_3$:$Eu_2O_3$:MgO:$SiO_2$. The weighed powdery materials were placed in water and mixed in a ball mill for 15 hours, to give a slurry of the powdery mixture. The resulting slurry was dried in a rotary evaporator to give a dry powder. The dry powder was placed in an alumina crucible and calcined under atmospheric conditions at 800° C. for 3 hours. The calcined powder was allowed to stand at room temperature and further calcined under a mixed gas condition (2 vol. % hydrogen-98 vol. % argon) at 1,220° C. for 3 hours, to yield a blue light-emitting SMS phosphor having the formula of $Sr_{2.57}Ca_{0.36}Eu_{0.07}MgSi_2O_8$.

The temperature-dependent emission strength of the resulting blue light-emitting SMS phosphor was determined by the below-described method. The molar ratio of Sr and Ca and the determined temperature-dependent emission strength of the resulting blue light-emitting SMS phosphors are shown in Table 1.

[Method for Determining the Temperature-Dependent Emission Strength]

The specimen (blue light-emitting SMS phosphor) was heated at a temperature elevation rate of 10° C./min. At the respective times when the temperature reaches 30° C., 50° C., 100° C. and 150° C., the phosphor was kept at that temperature for 5 minutes. The phosphor was further kept at that temperature and exposed to ultra-violet rays (wavelength 400 nm) from a Xenon lamp. The highest peak of emission spectrum in the wavelength region of 400 to 500 nm was identified and its emission strength (peak strength) was measured to give the object emission strength. The emission strength was given in terms of a value relative to the emission strength (100) of the blue light-emitting SMS phosphor prepared in Comparison Example 1 described later and heated to 30° C.

Example 2

A blue light-emitting SMS phosphor was prepared in the same manner as in Example 1 except that the powdery materials were mixed to give a molar ratio of 2.295:0.125:0.510:0.035:1:2.000 for $SrCO_3$:$SrCl_2.6H_2O$:$CaCO_3$:$Eu_2O_3$:MgO:$SiO_2$, to give a blue light-emitting SMS phosphor having the formula of $Sr_{2.42}Ca_{0.51}Eu_{0.07}MgSi_2O_8$.

The temperature-dependent emission strength of the resulting blue light-emitting SMS phosphor was determined by the above-described method. The molar ratio of Sr and Ca and the determined temperature-dependent emission strength of the resulting blue light-emitting SMS phosphors are shown in Table 1.

Comparison Example 1

A blue light-emitting SMS phosphor was prepared from the powdery $SrCO_3$, powdery $SrCl_2.6H_2O$, powdery $Eu_2O_3$, powdery MgO and powdery $SiO_2$ were weighed to give a molar ratio of 2.805:0.125:0.035:1:2.000 for $SrCO_3$:$SrCl_2.6H_2O$:$Eu_2O_3$:MgO:$SiO_2$. The procedures for the preparation of the blue light-emitting SMS phosphor described in Example 1 were repeated except for using a mixture of the above-mentioned powdery materials, to give a blue light-emitting SMS phosphor having the formula of $Sr_{2.93}Eu_{0.07}MgSi_2O_8$.

The temperature-dependent emission strength of the resulting blue light-emitting SMS phosphor was determined by the above-described method. The molar ratio of Sr and Ca and the determined temperature-dependent emission strength of the resulting blue light-emitting SMS phosphors are shown in Table 1.

The temperature-dependent emission strength of the resulting blue light-emitting SMS phosphor was determined by the aforementioned method. The molar ratio of Sr and Ca and the determined temperature-dependent emission strength of the resulting blue light-emitting SMS phosphors are shown in Table 1.

Comparison Example 2

A blue light-emitting SMS phosphor was prepared in the same manner as in Example 1 except that the powdery materials were mixed to give a molar ratio of 2.655:0.125:0.150:

0.035:1:2.000 for $SrCO_3:SrCl_2.6H_2O:CaCO_3:Eu_2O_3:MgO: SiO_2$, to give a blue light-emitting SMS phosphor having the formula of $Sr_{2.78}Ca_{0.15}Eu_{0.07}MgSi_2O_8$.

The temperature-dependent emission strength of the resulting blue light-emitting SMS phosphor was determined by the above-described method. The molar ratio of Sr and Ca and the determined temperature-dependent emission strength of the resulting blue light-emitting SMS phosphors are shown in Table 1.

Comparison Example 3

A blue light-emitting SMS phosphor was prepared in the same manner as in Example 1 except that the powdery materials were mixed to give a molar ratio of 2.055:0.125:0.750: 0.035:1:2.000 for $SrCO_3:SrCl_2.6H_2O:CaCO_3:Eu_2O_3:MgO: SiO_2$, to give a blue light-emitting SMS phosphor having the formula of $Sr_{2.18}Ca_{0.75}Eu_{0.07}MgSi_2O_8$.

The temperature-dependent emission strength of the resulting blue light-emitting SMS phosphor was determined by the above-described method. The molar ratio of Sr and Ca and the determined temperature-dependent emission strength of the resulting blue light-emitting SMS phosphors are shown in Table 1.

TABLE 1

| | Sr:Ca molar ratio | Temperature-dependency of emission strength | | | |
|---|---|---|---|---|---|
| | | 30° C. | 50° C. | 100° C. | 150° C. |
| Example 1 | 1:0.14 | 100 | 97 | 86 | 76 |
| Example 2 | 1:0.21 | 105 | 101 | 90 | 78 |
| Com. Ex. 1 | no Ca | 100 | 96 | 83 | 72 |
| Com. Ex. 2 | 1:0.05 | 98 | 93 | 81 | 70 |
| Com. Ex. 3 | 1:0.34 | 91 | 86 | 77 | 66 |

The experimental results shown in Table 1 indicate that the blue light-emitting SMS phosphors according to the invention (Examples 1 and 2) in which Sr was replaced with Ca in a ratio defined by the invention show a relatively high emission strength in the vicinity of 120° C. (100 to 150° C.), as compared with the blue light-emitting SMS phosphor containing no Ca (Comparison Example 1) as well as the blue light-emitting SMS phosphors in which Sr was replaced in an amount outside of the range defined in the invention (Comparison Examples 2 and 3). Therefore, it was revealed that the blue light-emitting SMS phosphor gives less temperature-dependent emission strength.

Example 3

A blue light-emitting SMS phosphor was prepared from the powdery $SrCO_3$, powdery $SrCl_2.6H_2O$, powdery $CaCO_3$, powdery $Eu_2O_3$, powdery $Y_2O_3$, powdery MgO and powdery $SiO_2$ were weighed to give a molar ratio of 2.500:0.125: 0.300:0.035:0.0025:1:2.000 for $SrCO_3:SrCl_2.6H_2O:CaCO_3: Eu_2O_3:Y_2O_3:MgO:SiO_2$. The procedures for the preparation of the blue light-emitting SMS phosphor described in Example 1 were repeated except for using a mixture of the above-mentioned powdery materials, to give a blue light-emitting SMS phosphor having the formula of $Sr_{2.625}Ca_{0.300}Eu_{0.070}Y_{0.005}MgSi_2O_8$.

The temperature-dependent emission strength of the resulting blue light-emitting SMS phosphor was determined by the above-described method. The molar ratio of Sr and Ca and the determined temperature-dependent emission strength of the resulting blue light-emitting SMS phosphors are shown in Table 2.

Example 4

A blue light-emitting SMS phosphor was prepared in the same manner as in Example 3 except that the powdery materials were mixed to give a molar ratio of 2.440:0.125:0.360: 0.035:0.0025:1:2.000 for $SrCO_3:SrCl_2.6H_2O:CaCO_3: Eu_2O_3:Y_2O_3:MgO:SiO_2$, to give a blue light-emitting SMS phosphor having the formula of $Sr_{2.565}Ca_{0.360}Eu_{0.070}Y_{0.005}MgSi_2O_8$.

The temperature-dependent emission strength of the resulting blue light-emitting SMS phosphor was determined by the above-described method. The molar ratio of Sr and Ca and the determined temperature-dependent emission strength of the resulting blue light-emitting SMS phosphors are shown in Table 2.

Example 5

A blue light-emitting SMS phosphor was prepared in the same manner as in Example 3 except that the powdery materials were mixed to give a molar ratio of 2.350:0.125:0.450: 0.035:0.0025:1:2.000 for $SrCO_3:SrCl_2.6H_2O:CaCO_3: Eu_2O_3:Y_2O_3:MgO:SiO_2$, to give a blue light-emitting SMS phosphor having the formula of $Sr_{2.475}Ca_{0.450}Eu_{0.070}Y_{0.005}MgSi_2O_8$. The temperature-dependent emission strength of the resulting blue light-emitting SMS phosphor was determined by the above-described method. The molar ratio of Sr and Ca and the determined temperature-dependent emission strength of the resulting blue light-emitting SMS phosphors are shown in Table 2.

Example 6

A blue light-emitting SMS phosphor was prepared in the same manner as in Example 3 except that the powdery materials were mixed to give a molar ratio of 2.290:0.125:0.510: 0.035:0.0025:1:2.000 for $SrCO_3:SrCl_2.6H_2O:CaCO_3: Eu_2O_3:Y_2O_3:MgO:SiO_2$, to give a blue light-emitting SMS phosphor having the formula of $Sr_{2.415}Ca_{0.510}Eu_{0.070}Y_{0.005}MgSi_2O_8$. The temperature-dependent emission strength of the resulting blue light-emitting SMS phosphor was determined by the above-described method. The molar ratio of Sr and Ca and the determined temperature-dependent emission strength of the resulting blue light-emitting SMS phosphors are shown in Table 2.

Example 7

A blue light-emitting SMS phosphor was prepared in the same manner as in Example 3 except that the powdery materials were mixed to give a molar ratio of 2.200:0.125:0.600: 0.035:0.0025:1:2.000 for $SrCO_3:SrCl_2.6H_2O:CaCO_3: Eu_2O_3:Y_2O_3:MgO:SiO_2$, to give a blue light-emitting SMS phosphor having the formula of $Sr_{2.325}Ca_{0.600}Eu_{0.070}Y_{0.005}MgSi_2O_8$.

The temperature-dependent emission strength of the resulting blue light-emitting SMS phosphor was determined by the above-described method. The molar ratio of Sr and Ca and the determined temperature-dependent emission strength of the resulting blue light-emitting SMS phosphors are shown in Table 2.

Example 8

A blue light-emitting SMS phosphor was prepared in the same manner as in Example 3 except that the powdery materials were mixed to give a molar ratio of 2.140:0.125:0.660: 0.035:0.0025:1:2.000 for $SrCO_3$:$SrCl_2$.$6H_2O$:$CaCO_3$: $Eu_2O_3$:$Y_2O_3$:MgO:$SiO_2$, to give a blue light-emitting SMS phosphor having the formula of $Sr_{2.265}Ca_{0.660}Eu_{0.070}Y_{0.005}MgSi_2O_8$.

The temperature-dependent emission strength of the resulting blue light-emitting SMS phosphor was determined by the above-described method. The molar ratio of Sr and Ca and the determined temperature-dependent emission strength of the resulting blue light-emitting SMS phosphors are shown in Table 2.

TABLE 2

| | Sr:Ca molar ratio | Temperature-dependency of emission strength | | | |
|---|---|---|---|---|---|
| | | 30° C. | 50° C. | 100° C. | 150° C. |
| Example 3 | 1:0.11 | 106 | 99 | 89 | 77 |
| Example 4 | 1:0.14 | 107 | 104 | 92 | 81 |
| Example 5 | 1:0.18 | 109 | 104 | 96 | 83 |
| Example 6 | 1:0.21 | 112 | 108 | 96 | 84 |
| Example 7 | 1:0.26 | 106 | 102 | 90 | 78 |
| Example 8 | 1:0.29 | 106 | 101 | 90 | 77 |

The experimental results shown in Table 2 indicate that the blue light-emitting SMS phosphors in which a portion of Sr was replaced with Ca and which is co-activated with Y show a relatively high emission strength under high temperature conditions in the vicinity of 120° C., and the emission strength is highly stable.

EXPLANATION OF SYMBOLS 1 base
2 adhesive
3 semiconductor light-emitting element
4a,4b electrode
5a,5b lead wire
6 resin layer
7 phosphor layer
8 light-reflecting material
9a,9b electric wire

What is claimed is:

1. A blue light-emitting phosphor having a merwinite crystal structure and an elemental formula of $(Sr,Ca)_3MgSi_2O_8$ activated with Eu and at least one rare earth metal element selected from the group consisting of Sc, Y, Gd, Tb and La in which a molar ratio of Sr and Ca is in the range 1:0.13 to 1:0.23, in which Eu is contained in an amount of 0.01 to 0.20 mol per one mol of Mg.

2. A light-emitting device comprising a blue-light-emitting phosphor having a merwinite crystal structure and an elemental formula of $(Sr,Ca)_3MgSi_2O_8$ activated with Eu in which a molar ratio of Sr and Ca is in the range of 1:0.10 to 1:0.30, in which Eu is contained in an amount of 0.01 to 0.20 mol per one mol of Mg and a semiconductor light-emitting element which releases a light in the wavelength region of 350 to 430 nm.

* * * * *